(12) United States Patent
Clement et al.

(10) Patent No.: US 7,190,293 B2
(45) Date of Patent: Mar. 13, 2007

(54) SIGMA-DELTA ANALOG-TO-DIGITAL CONVERTER AND METHOD FOR REDUCING HARMONICS

(75) Inventors: Patrick Clement, Bussigny (CH); Nadim Khlat, Cugnaux (CH)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/515,561

(22) PCT Filed: May 19, 2003

(86) PCT No.: PCT/EP03/05266

§ 371 (c)(1), (2), (4) Date: Jan. 17, 2006

(87) PCT Pub. No.: WO03/098808

PCT Pub. Date: Nov. 27, 2003

(65) Prior Publication Data

US 2006/0145900 A1    Jul. 6, 2006

(30) Foreign Application Priority Data

May 22, 2002    (EP) .................... 02291255

(51) Int. Cl.
*H03M 1/12* (2006.01)
(52) U.S. Cl. ................... 341/143; 341/155
(58) Field of Classification Search .......... 341/155, 341/143, 159, 120, 118
See application file for complete search history.

(56) References Cited

U.S. PATENT DOCUMENTS

| | | | | |
|---|---|---|---|---|
| 5,363,101 A * | 11/1994 | Ueki | ............... | 341/143 |
| 5,745,063 A * | 4/1998 | Gruber et al. | ............... | 341/143 |
| 5,821,782 A * | 10/1998 | Carloni et al. | ............... | 327/105 |
| 5,835,044 A | 11/1998 | Nishino | | |
| 5,847,619 A * | 12/1998 | Kirisawa | ............... | 332/103 |
| 6,121,910 A * | 9/2000 | Khoury et al. | ............... | 341/143 |
| 6,275,540 B1 * | 8/2001 | Barrett et al. | ............... | 375/316 |
| 6,611,569 B1 * | 8/2003 | Schier et al. | ............... | 375/322 |
| 6,683,905 B1 * | 1/2004 | King et al. | ............... | 375/141 |
| 2003/0012307 A1 * | 1/2003 | Martin | ............... | 375/324 |

FOREIGN PATENT DOCUMENTS

| | | |
|---|---|---|
| GB | 2233518 A | 1/1991 |
| GB | 2364188 A | 1/2002 |

OTHER PUBLICATIONS

Eerola et al., "Direct Conversion Using Lowpass Sigma-Delta Modulation," IEEE Proceedings of the International Symposium on Circuits and Systems, vol. 4, Conf. 25, 1992, p. 2653-2656, no month.

* cited by examiner

*Primary Examiner*—Peguy JeanPierre (57) ABSTRACT

An arrangement (100) and method for sigma-delta analog-to-digital conversion by providing parallel translating sigma-delta analog-to-digital converters (21, 22) and summing their outputs to produce a digital output signal having a bandwidth greater than that of the first or second translating sigma-delta analog-to-digital converters (21, 22). The parallel translating sigma-delta analog-to-digital converters (21, 22) use switching sequences arranged to cancel third and fifth harmonics in the digital output signal. Orthogonality error in the switching sequences applied to the sigma-delta modulators is compensated by adjusting the phase of the signals applied to mixers (51, 52).

19 Claims, 13 Drawing Sheets

SIGMA-DELTA ANALOG-TO-DIGITAL CONVERTER AND METHOD FOR REDUCING HARMONICS

This application is a 371 of PCT/EP03/05266 filed on May 19, 2003.

1. Field of the Invention

This invention relates to analog-to-digital converters, and particularly (though not exclusively) to such converters as may be used in integrated circuits for use in wireless communications.

2. Background of the Invention

In the field of this invention it is known that, in practice, converting an analog signal to the digital domain with a resolution equal to or higher than 12 bits requires using a sigma-delta modulator. Not using an oversampled converter, as in a pipeline converter for example, leads to stringent capacitor matching requirement, thus limiting the resolution to 10–12 bits; it is well known that sigma-delta converters allow this limitation to be overcome. However, the oversampling requirement inherent to sigma-delta converters has historically limited the signal bandwidth. There has been a trend in the recent past to increase bandwidth for application in the wireless communication area, such as for GSM (Global System for Mobile communications) or CDMA (Code Division Multiple Access) bandwidth. However, converting a wider bandwidth with a resolution of 12 bits or more requires new solutions. For example, converting the WCDMA (Wideband CDMA) baseband signal means converting a bandwidth of nearly 2 MHz. Several approaches could be considered, each of them having its own drawbacks.

Starting with Nyquist rate converters, as mentioned above, pipeline converters lead to stringent capacitor matching requirement which usually limits the resolution below 12 bits. Additionally, handling a 2 MHz bandwidth would require amplifiers with a very high unity gain bandwidth, up to 500 MHz.

A second alternative of a Nyquist rate converter is a timely-interleaved multipath pipeline converter. This alternative would lower the conversion rate of each pipeline converter but in general suffers from a fixed pattern noise resulting in input offset and gain matching errors among the parallel pipeline converters. The capacitor matching requirement would also remain an issue for resolutions above 12 bits.

Considering an oversampled converter, the appropriate shaping of the quantisation noise either requires increasing the order of the sigma-delta modulation or necessitates a very high sampling frequency. Stability or matching constraints do not make it possible to extend the order to a very high extent and, overall, the sampling frequency could have to be increased far beyond 100 MHz. This would typically require extra circuits such as a PLL (Phase Locked Loop) to generate the sampling clock. Moreover, for many implementations a strict requirement might be put on the phase noise of the PLL in order to achieve 12-bit resolution in the converter.

Another possible alternative is a Hadamard modulator architecture, which would lower the sampling rate but would require many parallel paths and hence would occupy a large integrated circuit silicon area.

A need therefore exists for a sigma-delta analog-to-digital converter arrangement and method wherein the abovementioned disadvantage(s) may be alleviated.

STATEMENT OF INVENTION

In accordance with a first aspect of the present invention there is provided a sigma-delta analog-to-digital converter arrangement as claimed in claim 1.

In accordance with a second aspect of the present invention there is provided a method for sigma-delta analog-to-digital conversion as claimed in claim 17.

BRIEF DESCRIPTION OF THE DRAWINGS

One parallel translating sigma-delta analog-to-digital converter arrangement and method incorporating the present invention will now be described, by way of example only, with reference to the accompanying drawings, in which.

DESCRIPTION OF PREFERRED EMBODIMENT

Briefly stated, a preferred embodiment of the present invention converts analog signals into digital signals by combining two identical low-pass sigma-delta converters in such a way that the signal bandwidth is extended by a 2-fold factor.

Figure 1:
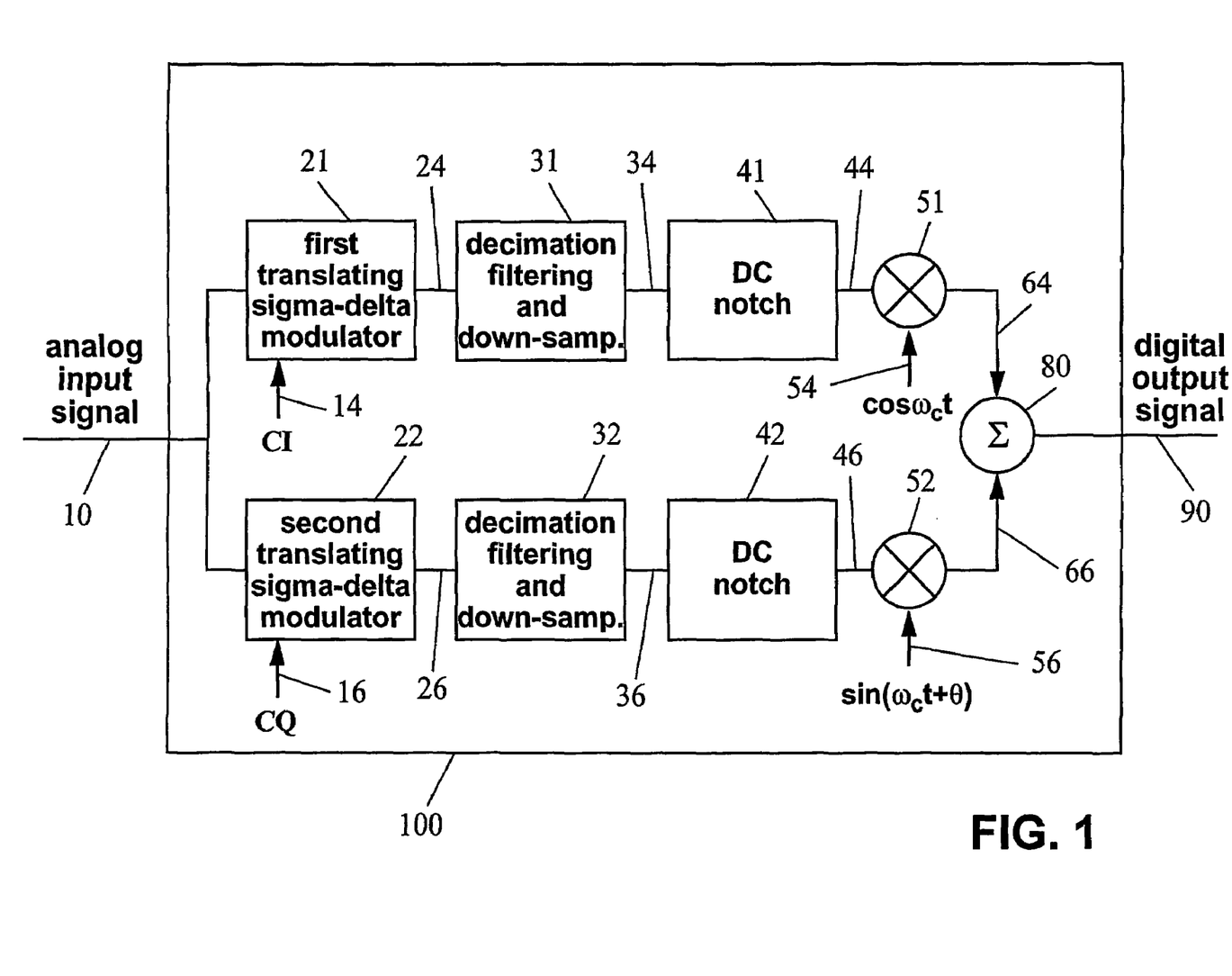
FIG. 1 is a block schematic diagram illustrating a parallel translating sigma-delta analog-to-digital converter arrangement incorporating the present invention.

Referring firstly to FIG. 1, an analog-to-digital converter (ADC) arrangement 100 receives an analog input signal 10, and delivers a digital output signal 90. The ADC arrangement 100 is split into two parallel paths:

the first path comprising translating sigma-modulator block 21, decimation filter and down-sampling block 31, DC notch filter block 41 and mixer block 51; and the second path comprising translating sigma-modulator block 22, decimation filter and down-sampling block 32, DC notch filter block 42 and mixer block 52.

As will be explained in more detail below, in the first and second paths the split signals are subjected to phase shifts nominally in quadrature and are processed in reduced bandwidth frequency bands, to produce the summed digital output signal 90 with a frequency bandwidth greater than the reduced frequency band.

Blocks 21 and 22 are low-pass sigma-delta modulators. Low-pass sigma-delta modulation is a well known function to quantize a signal and sample it at a much higher rate than the Nyquist rate such that most of the quantisation noise is pushed towards high frequencies. Thus, the SNR (Signal-to-Noise Ratio) in the low pass region can be made high, making the modulator suitable for processing baseband signals. The SNR, and therefore the resolution, and the signal bandwidth where this SNR is achieved can be increased by increasing the order of the sigma-delta modulator (SDM) and the sampling frequency. However, this principle can not be applied beyond certain limits. Therefore, in the arrangement 100 the signal bandwidth is doubled by having a sigma-delta modulator only processing half of the bandwidth of the signal to be converted with an appropriate SNR. For this purpose, the analog input signal 10 is first frequency-translated at the input of each SDM 21 and 22.

In a discrete-time SDM, the sampling operation occurs in the input stage of the SDM, usually by sampling the analog input signal onto a sampling capacitor by means of a switched-capacitor arrangement. It is well known that a switching operation mixes an input signal with the switching signal controlling the switches. By adequately choosing the switching signals, it is therefore possible to produce a frequency translation of the spectrum of the input signal. However, in the ADC arrangement 100 this frequency shift must be in the order of half the signal bandwidth to be converted. Considering as an example a WCDMA signal, the bandwidth to be converted is in the order of 2 MHz and the frequency shift needs to be in the order of 1 MHz. A switching signal is a digital signal and, therefore, may exhibit a high level of harmonics, especially when considering that the switching signal needs to be built relative to the sampling frequency.

Figure 2:
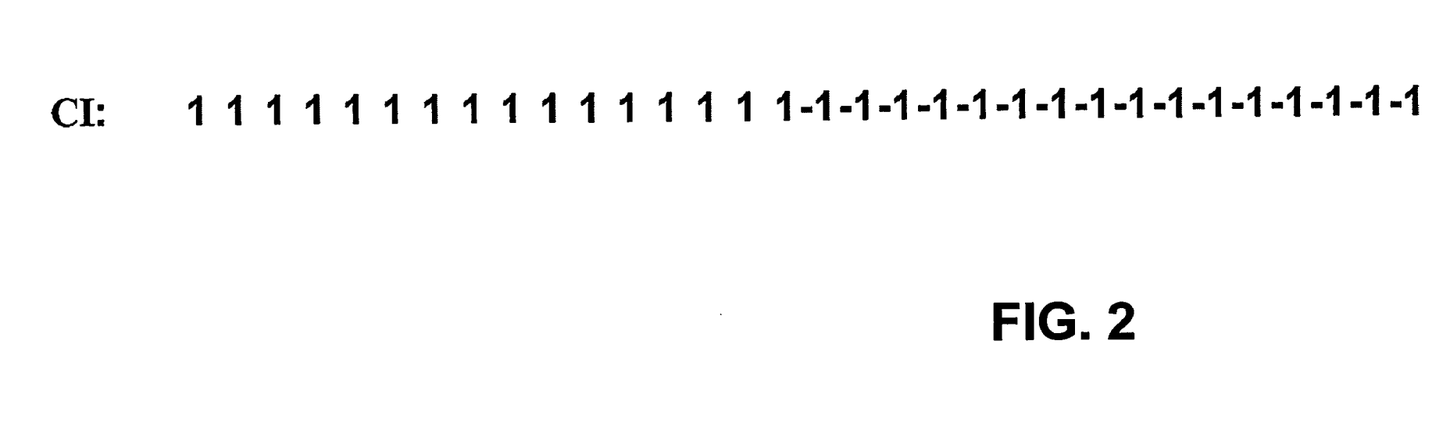
FIG. 2 illustrates a switching sequence whose use in the sigma-delta analog-to-digital converter arrangement of FIG. 1 would produce significant third and fifth harmonics.
Figure 3:
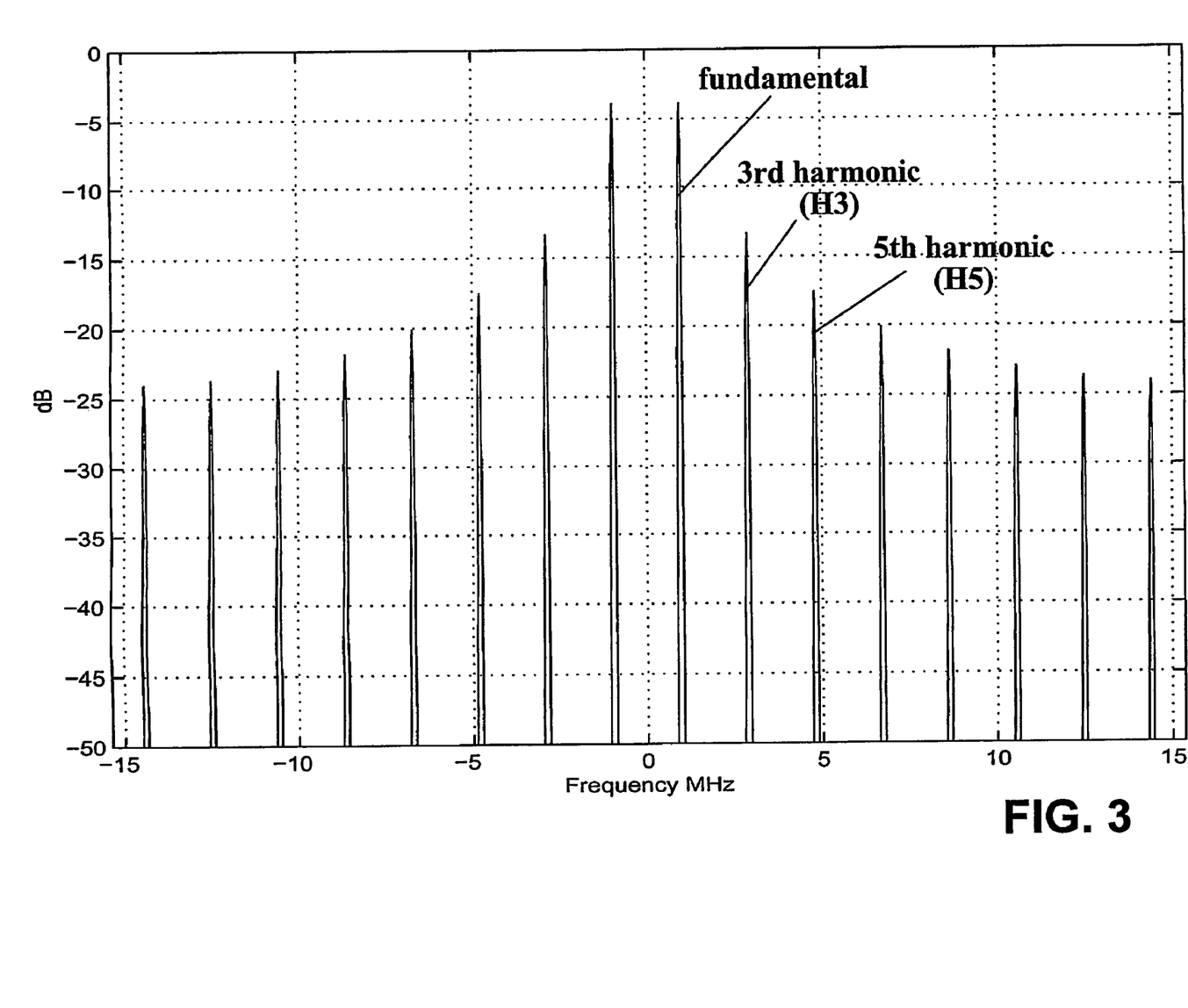
FIG. 3 illustrates the spectrum associated with the switching sequence of FIG. 3.

Taking as an example a sampling rate of 30.72 MHz, which is an 8-fold multiple of the 3.84 MHz chip rate of a WCDMA receiver, a basic switching signal could alternate sixteen states to 1 and sixteen states to −1. Here, the state definition relates to an analog input signal applied in a well-known differential mode between a positive node and a negative node. A state of 1 on the switching signal means that the differential analog input signal is sampled in the SDM input stage in a straightforward manner while a state of −1 means that the differential analog input signal is sampled in a cross-coupled manner, the positive input node being sampled and applied to the negative section of the differential SDM structure and the negative input node being sampled and applied to the positive section of the differential SDM structure. One period of such a basic switching scheme is illustrated in FIG. 2. The frequency spectrum of this switching signal is shown in FIG. 3, from which it may be observed that the spectrum contains many high level harmonics. The closest ones, namely the third harmonic (H3) and the fifth harmonic (H5) would mix with interferers that could be present in the analog input signal (e.g., in an adjacent channel and an alternate channel of wireless communication system) and would be folded in the same frequency band as the wanted signal present in the analog input signal. This drawback could be avoided by drastically filtering these interferers prior to the ADC operation. However, such filtering would be expensive.

The present invention allows for a simpler solution: Instead of using a single sampling structure, several sampling structures may be combined together in order to remove some harmonics from the spectrum resulting from their combination. A well known arrangement meeting this property uses Walsh functions as switching sequences. However, a drawback of using Walsh functions is the need for non-integer weighting factors which would have to turn into non-round values of sampling capacitors in the switched-capacitor input stage of the SDM. This would increase the sensitivity of the overall ADC performance to the capacitor mismatch.

Figure 4:
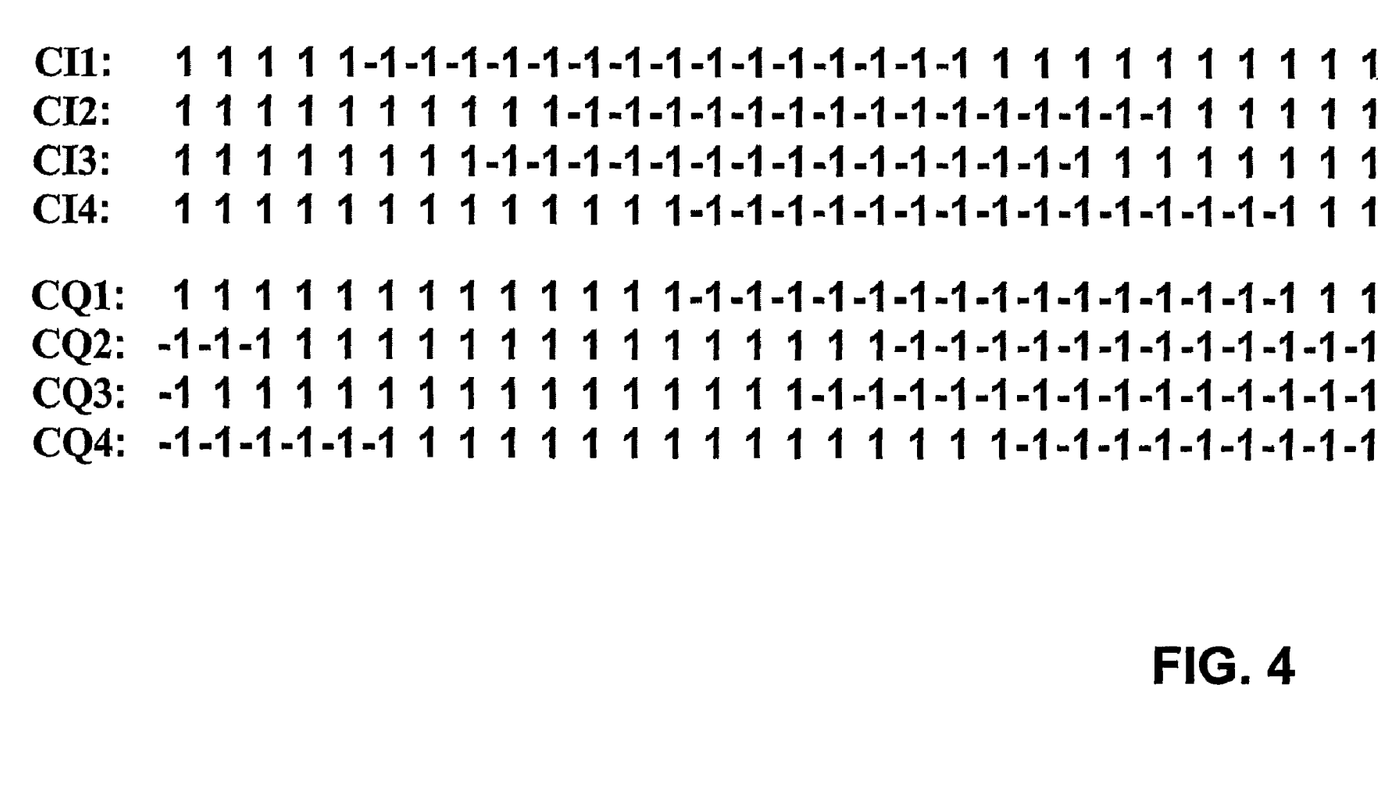
FIG. 4 illustrates switching sequences which could be used for frequency translating in the sigma-delta analog-to-digital converter arrangement of FIG. 1.
Figure 5:
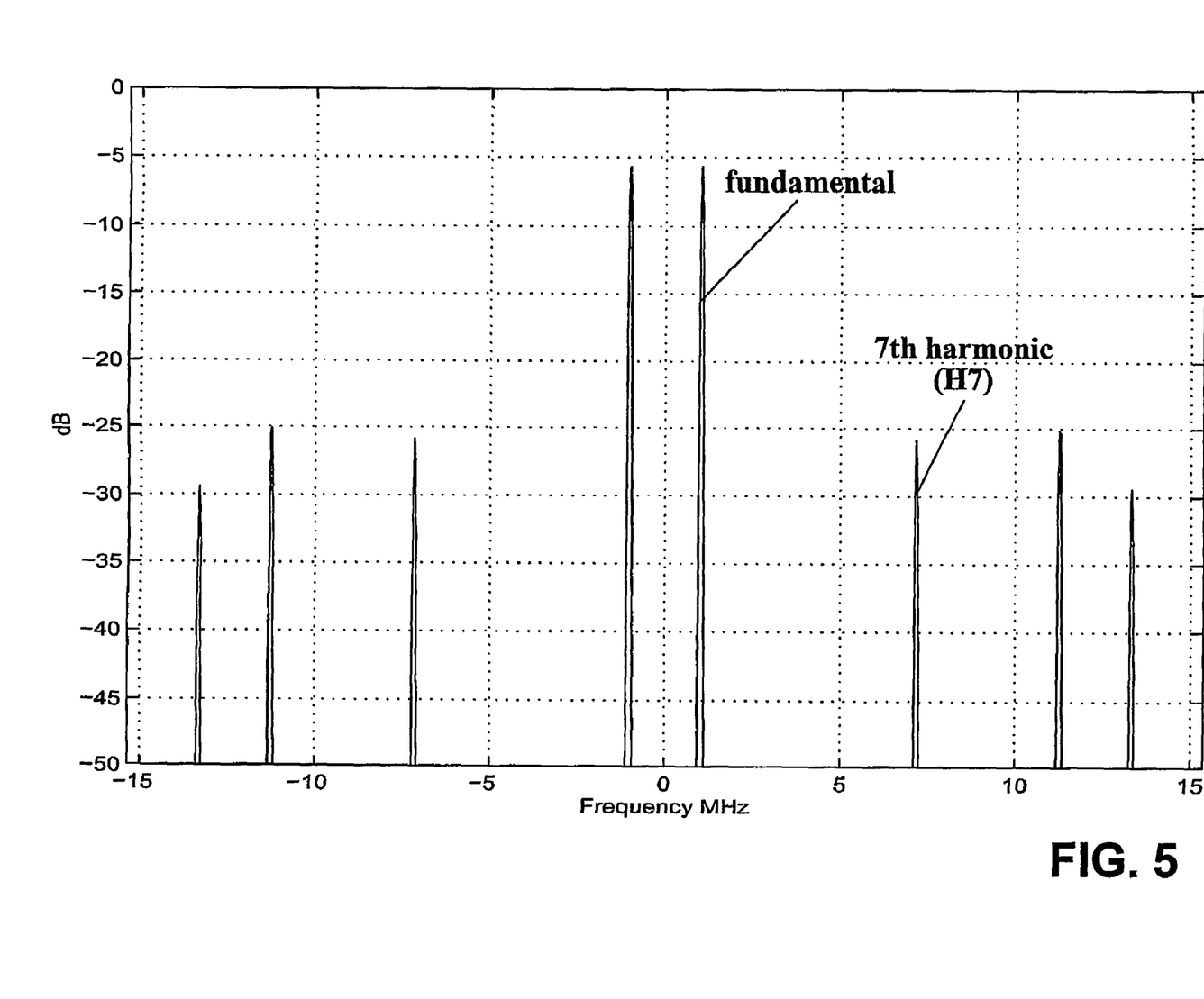
FIG. 5 illustrates the spectrum associated with the switching sequences of FIG. 4.

The ADC arrangement 100 relies on using a combination of switching sequences which are delayed against each other such that the third and fifth harmonics are removed or at least very significantly attenuated in the frequency spectrum of their combination. FIG. 4 shows two sets of switching sequences having this property. The first set comprising CI1 to CI4 is intended for use in the first SDM, 21, of FIG. 1. The second set comprising CQ1 to CQ4 is intended for use in the second SDM, 22, of FIG. 1. Summing together the sequences CI1 to CI4 or CQ1 to CQ4 produces the spectrum shown in FIG. 5, from which it may be observed that this spectrum does not exhibit any significant third or fifth harmonic contribution.

The nearest harmonic is the seventh, thus significantly relaxing the requirements of the analog filter needed in front of the ADC. In practice, such a filter is required anyway for anti-aliasing purpose with regard to the sampling frequency used in the ADC. Applying the switching sequences shown in FIG. 4 allows the analog filter requirement not to be increased with regard to the usual anti-aliasing constraint.

It will be understood that alternatively to using switching sequences having unit coefficients as shown in FIG. 4, switching sequences having binary weighted coefficients in combinations of the FIG. 4 switching sequences (e.g., +2, 0, −2 or +4, +2, 0, −2, −4) may be used.

Figure 6:
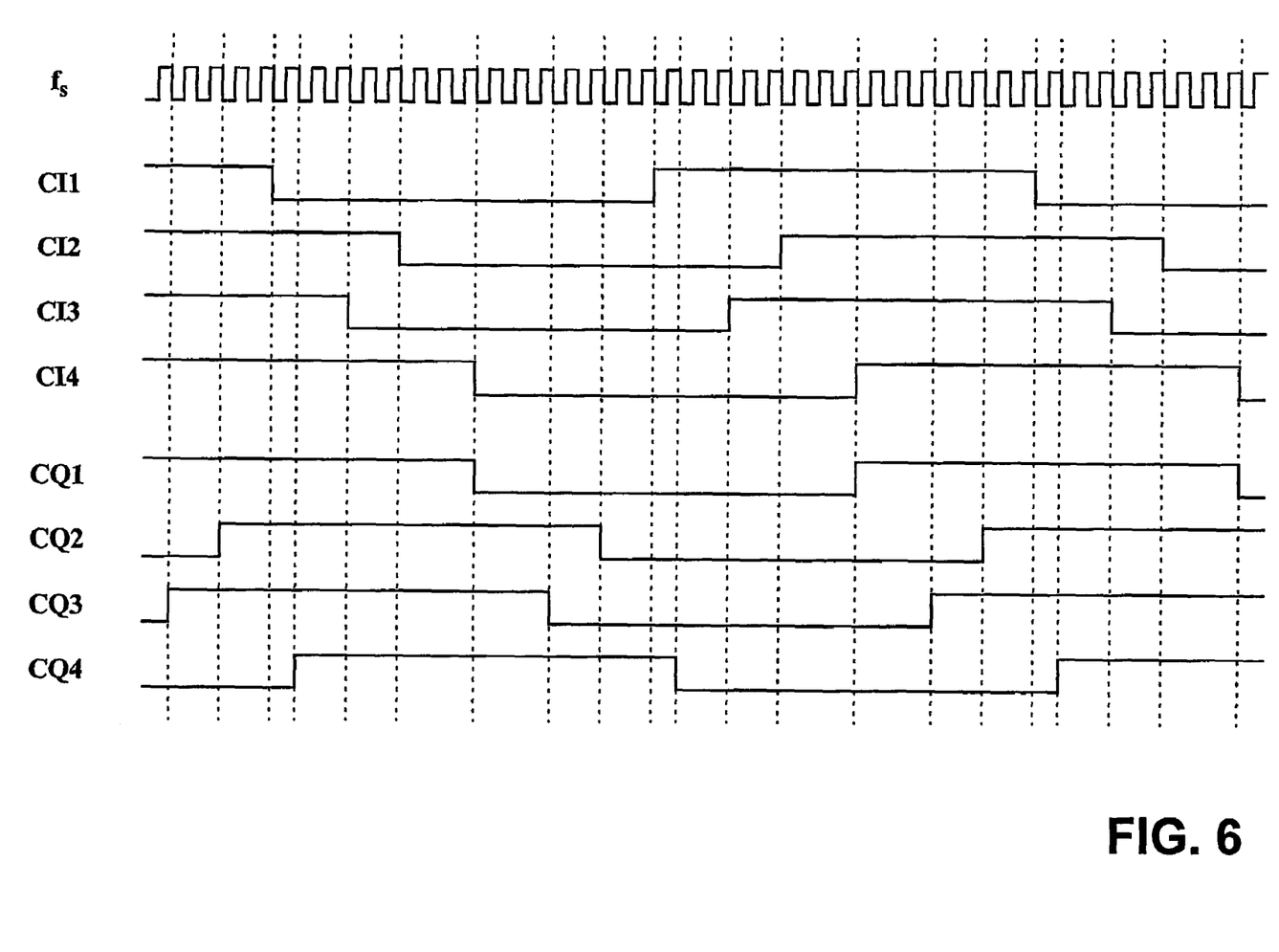
FIG. 6 illustrates a timing diagram representation of the switching sequences of FIG. 4.
Figure 7:
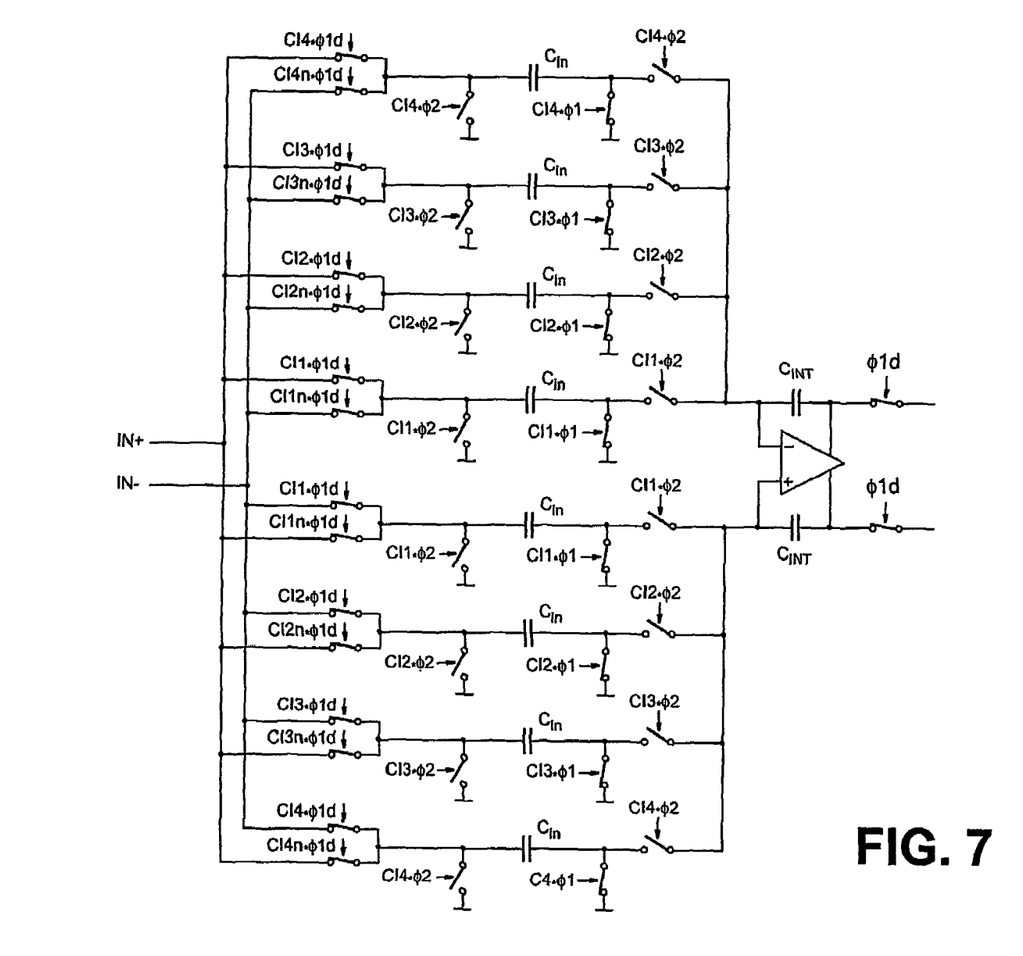
FIG. 7 illustrates a possible embodiment for a sigma-delta modulator differential input stage used in the sigma-delta analog-to-digital converter arrangement of FIG. 1 with the switching sequences of FIG. 4.

FIG. 7 shows an example of the way the switching sequences of FIG. 4 may be applied and combined into a switched-capacitor input stage of a SDM. Such a classical differential stage would just use two equally-sized sampling capacitors switched by means of switches controlled by several non-overlapping or delayed clock phases, namely Φ1, Φ2 and Φ1d in FIG. 7. In the present embodiment of the invention, eight equally sized capacitors may be used instead of two and the switches may be controlled by a logic combination of the clock phases and the control sequences CI1 to CI4 in the first SDM, 21, or CQ1 to CQ4 in 22. As this solution uses equally sized capacitors, this minimises the sensitivity to capacitor mismatch. The switching sequences have been translated into control signals in the timing diagram of FIG. 6.

It may be noted that the periodicity of the switching sequences determines that the fundamental is equal to the sampling frequency divided by 30 in this example. Thus, this would make the fundamental frequency equal to 30.72 MHz/30=1.024 MHz, which is approximately half of the signal bandwidth to be converted. An alternative solution for implementing the combination of the switching sequences could consist in adding the four sequences all together and using just binary-weighted capacitors with fewer switches. This would also keep the sensitivity to capacitor mismatch low.

Another alternative could be an intermediate solution where the switching sequences are added by pairs and applied, by means of a reduced number of switches compared to the first embodiment, to double-size capacitors.

In the diagram of FIG. 1, both SDM's are identical. However, the analog input signal is translated in a different way due to the phase shift between switching signals CI1 to CI4 on one side and CQ1 to CQ4 on another side. This translating operation will be compensated further along the processing flow by blocks 51 and 52 which are mixers having quadrature mixing signals 54 and 56 (and which provide a reverse process of frequency translation and phase shifting to that which occurred in the translating sigma-delta modulators 21 and 22 respectively). Therefore, the switching sequences applied to SDM's 21 and 22, or at least their combination or their overall effect should be in quadrature too. Actually they just need to almost be in quadrature. It may be observed in FIG. 4 and 6 that CI1 to CI4 are not perfectly in quadrature with CQ1 to CQ4 respectively. This allows the sampling frequency to be kept low while still having the appropriate delay between each switching signal. In FIG. 4 the quadrature error is $\pi/30$. This error may be compensated by adjusting the phase of the mixing signal 56 by means of the parameter $\theta$.

The order and the structure of the SDM's 21 and 22 has to be chosen according to the SNR performance of the ADC. Just considering the SNR of one SDM, the relevant spectrum portion for evaluating the SNR performance is half of the overall signal bandwidth that the ADC 100 is supposed to handle. Therefore, the SNR performance of one SDM should be the same as the target performance of the overall ADC because it handles approximately half of the total signal power and the half of the total noise power. In the diagram of the parallel translating ADC 100 of FIG. 1 the blocks 31 and 32 next to the SDM's 21 and 22 perform the decimation filtering and down-sampling of the signals 24 and 26 respectively, coming from blocks 21 and 22 respectively. Decimation filtering is a well known operation in a low-pass sigma-delta ADC. It allows removal of the quantisation and electronic noise between the top of the signal bandwidth and half of the sampling frequency used in the SDM. This makes it possible to re-sample the signal, after the decimation filtering, at a much lower frequency, usually close to the Nyquist rate with regard to the signal bandwidth. The decimation filtering may be handled by a single digital filter or by a cascade of several digital filters of various known types such as SINC (sin(x)/x) filters, FIR (Finite Impulse Response) filters, half-band filters, etc. In the parallel translating ADC arrangement 100 the transition band of the decimation filtering, between the passband and the stopband, needs to be sharp and very close to the end of the signal bandwidth handled by a SDM, i.e., half the total signal bandwidth of the overall ADC. In the above example the transition band needs to be slightly above 1 MHz. The selectivity of filtering beyond this limit is needed to ensure the proper behaviour of the overall ADC, 100. After the decimation filtering and the re-sampling of the digital signal, signals 34 and 36 pass through blocks 41 and 42 respectively in order to remove the DC offset produced in the SDM. If these blocks are omitted, the DC offset will be shifted in the next block, 51 or 52, at a non-DC frequency, thus producing an unwanted tone in the signal bandwidth. Omitting these blocks is therefore possible only if the DC offset is small enough to avoid degrading the SNR performance of the overall ADC. Blocks 41 and 42, called 'DC notch' in FIG. 1, perform high pass filtering signals of the signals 34 and 36 respectively, if needed. The cut-off frequency of this filter may be chosen as low as needed to avoid degrading the wanted signal.

The next processing stage comprises blocks 51 and 52. These blocks perform a mixing operation by multiplying the signal coming out of the DC notch filters, 44 and 46, by single-tone signals in quadrature, 54 and 56. These signals (as already explained) may have a slight phase adjustment to compensate for a quadrature error made on the switching signals at the input of the SDM's. The frequency of these single-tone signals needs to be equal to the fundamental of the switching signals. As both types of signals are digital, it is obvious that this relationship can easily be guaranteed. Moreover, it will be easily understood by a person of ordinary skill in this art that the single-tone mixing signals can be generated from the SDM sampling signal with the required frequency and phase accuracy by means of well-known arrangements, that need not be described in further detail.

The final stage in the ADC comprises an adder 80 to combine signals 64 and 66 coming out of the mixers 51 and 52 respectively. The adder 80 delivers a digital signal 90 with an SNR characteristic approximately equal to the SNR performance of each SDM, 21 or 22, while the SNR characteristic is available over the double of the bandwidth of each SDM. This allows sigma-delta modulation to be applied to double bandwidth signals without having to double the sampling frequency or to increase the complexity of the SDM.

Figure 8:
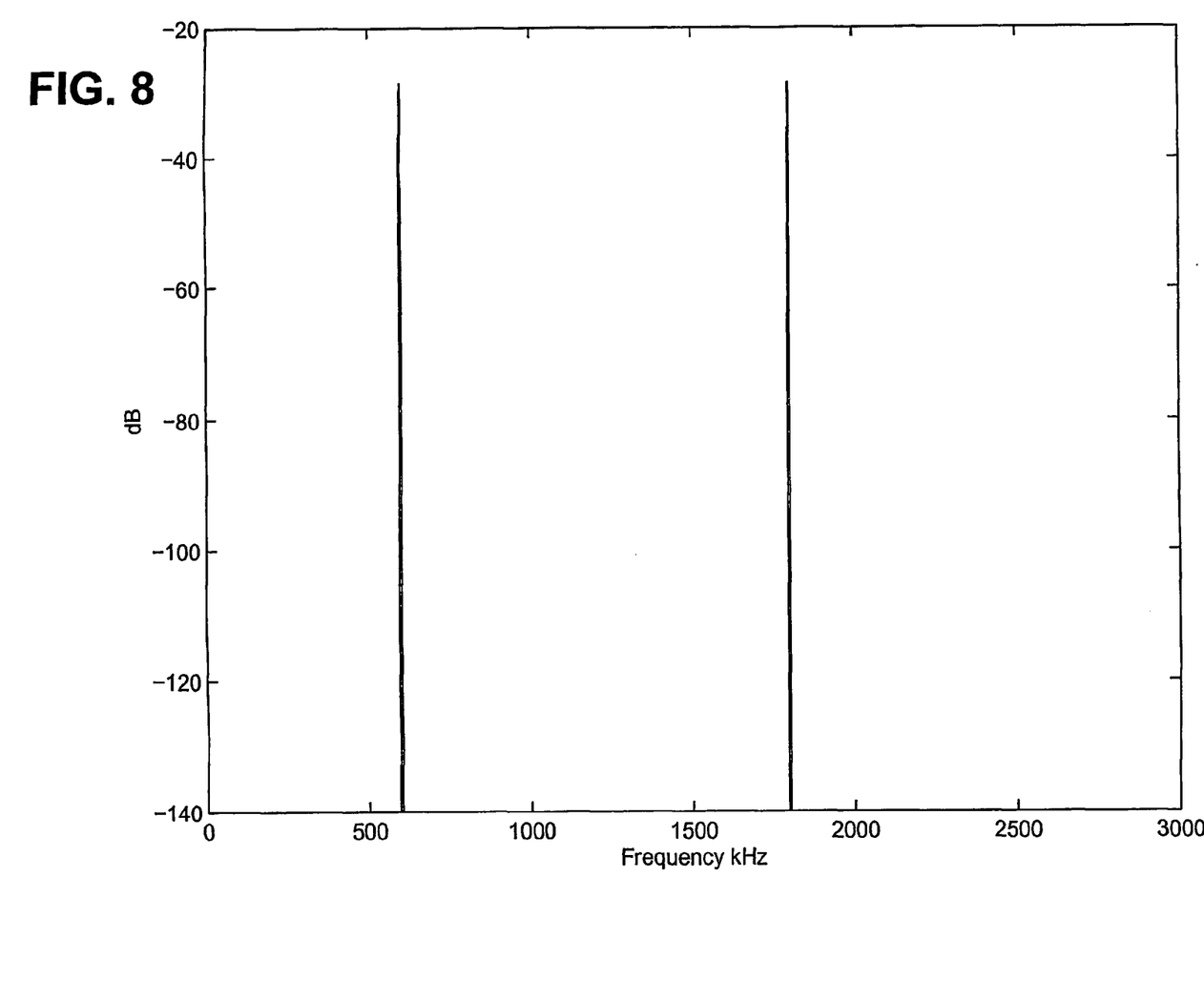
FIG. 8 illustrates the spectrum of an example of an input signal applied to the sigma-delta analog-to-digital converter arrangement of FIG. 1.
Figure 9:
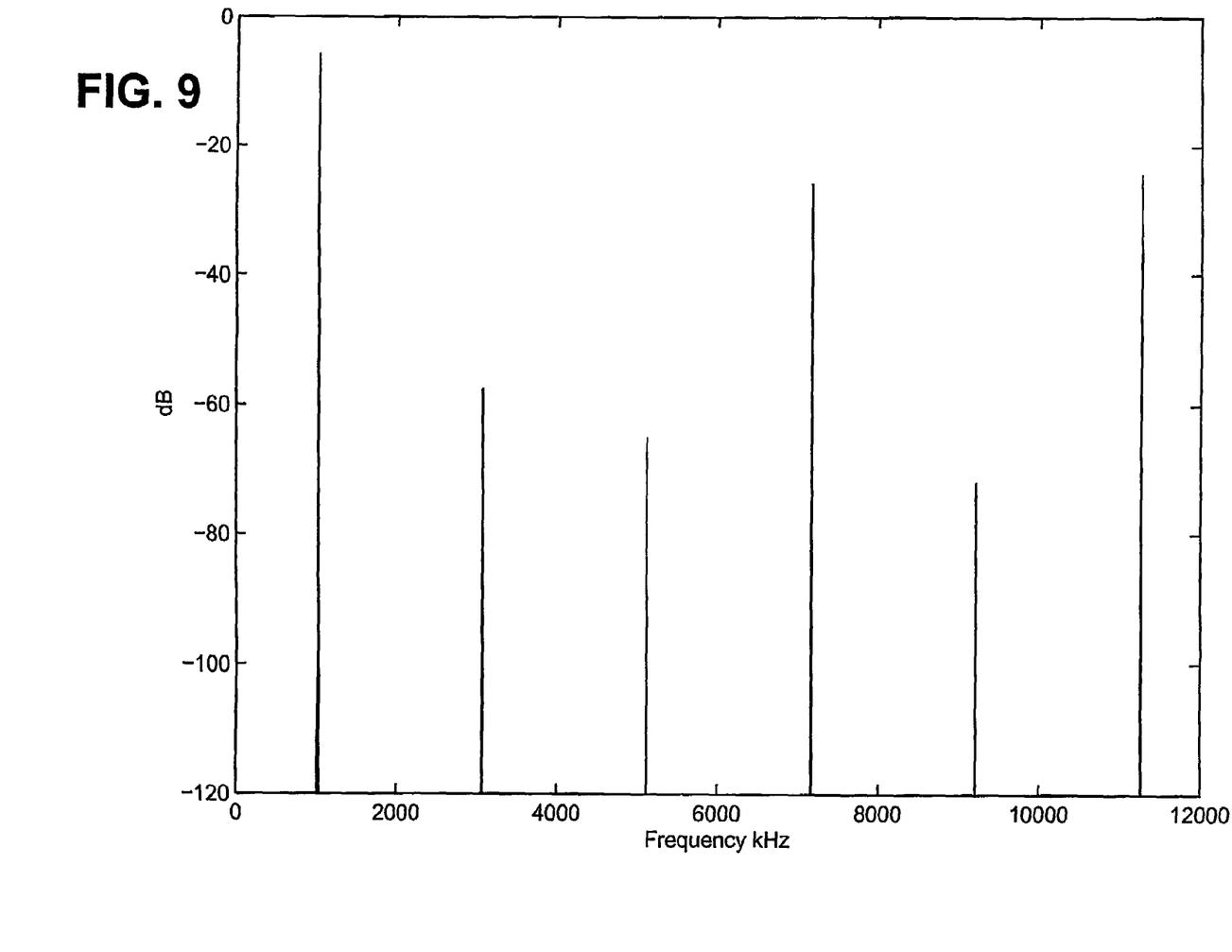
FIG. 9 illustrates the spectrum of an example of a sum of switching signals in the sigma-delta analog-to-digital converter arrangement of FIG. 1.
Figure 10:
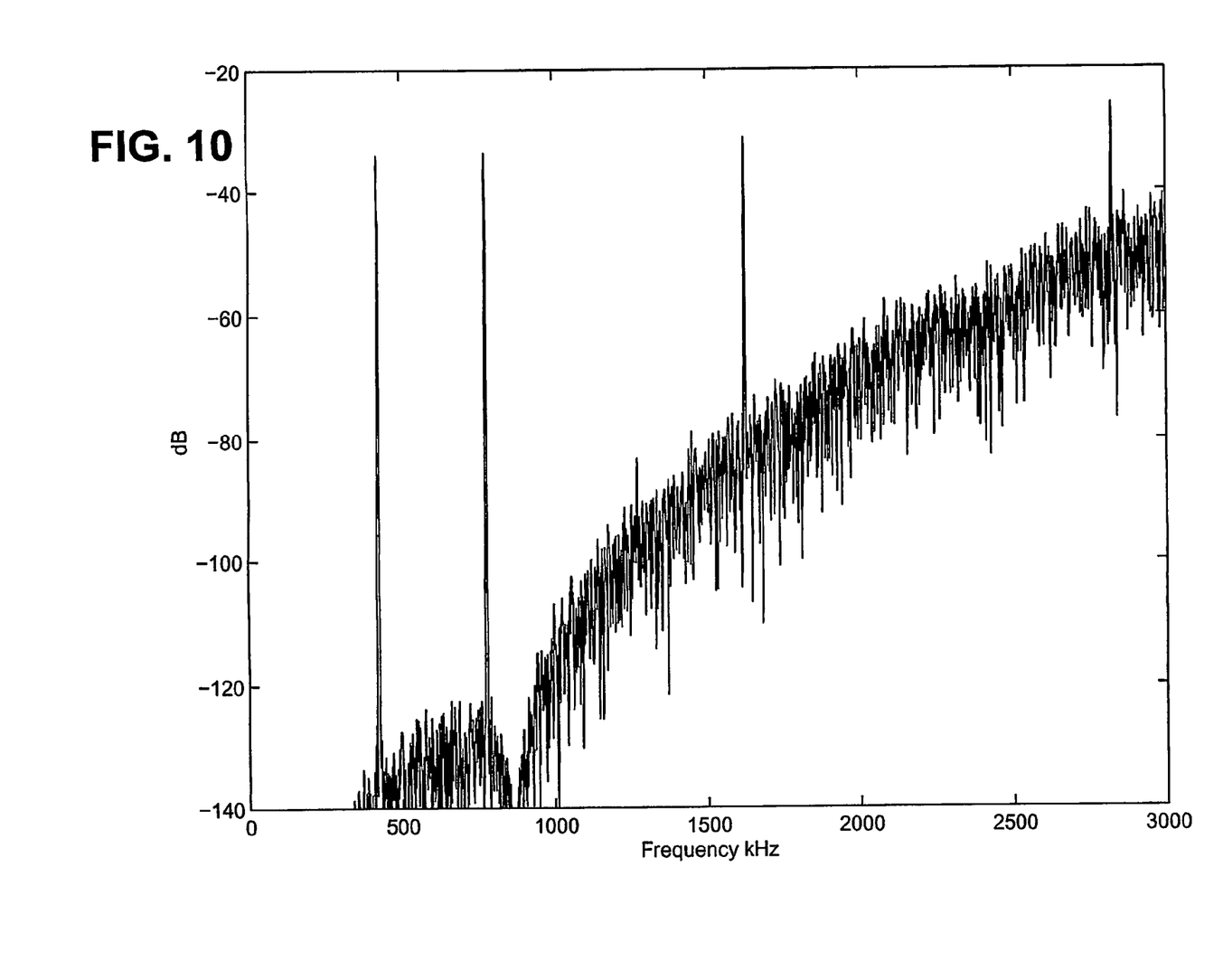
FIGS. 10–12 illustrate the spectra of examples of intermediate signals at various points along the processing flow of the sigma-delta analog-to-digital converter arrangement of FIG. 1.

FIG. 8 to 13 illustrate the signal processing for the example of sinusoidal signals spread in the WCDMA bandwidth. FIG. 8 shows a two-tone signal applied at the ADC input 10, with a frequency component at 600 kHz and another one at 1800 kHz. FIG. 9 shows the spectrum of the sum of the switching signals used in the input stage of each SDM, either made by summing CI1 to CI4 or CQ1 to CQ4 respectively. The fundamental, which is going to produce the frequency shift in this stage, is at 1024 kHz. Third and fifth harmonics are visible in this spectrum because some capacitor mismatch has been introduced for the purpose of illustration in the SDM input stage. FIG. 10 shows the spectrum of the signal at the output of the SDM stage, blocks 21 and 22. It should be noted that this is an amplitude spectrum; therefore, the phase difference is not visible in such a spectrum and FIG. 10 may serve as an illustrating plot for both signals 24 and 26. Two low frequency tones may be observed, at 1024 kHz−600 kHz=424 kHz and at 1800 kHz−1024 kHz=776 kHz. This illustrates the fact that the ADC input tones, which were spread in a 2 MHz bandwidth, now have contributions in a 1 MHz bandwidth where the quantisation noise is the lowest. As the quantisation noise results from a sixth order sigma-delta noise shaping in this example, a much higher quantisation noise level may be observed beyond 1 MHz. Two extra tones may also be noticed at 1024 kHz+600 kHz=1624 kHz and 1024 kHz+1800 kHz=2824 kHz.

Figure 11:
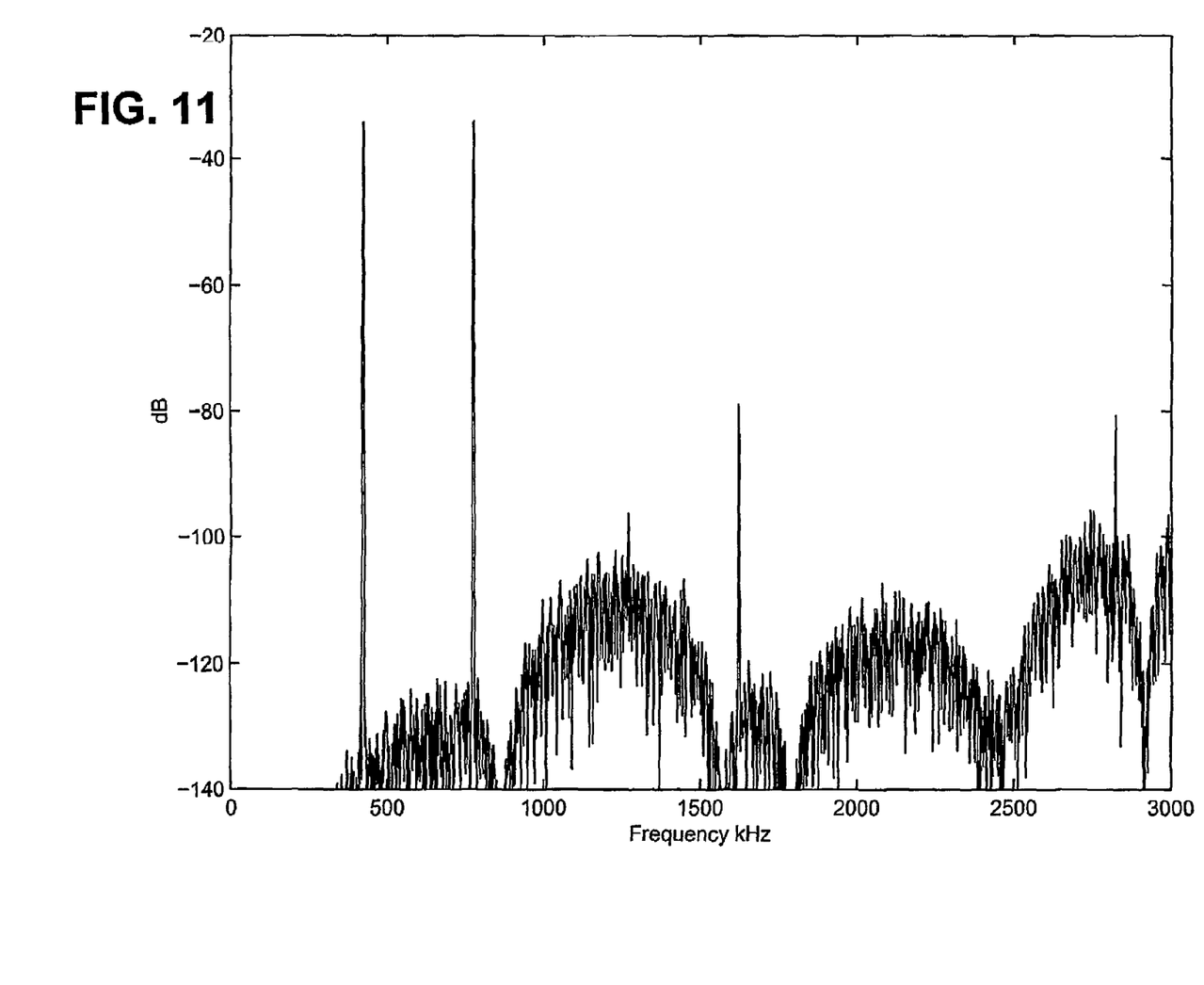
Figure 12:
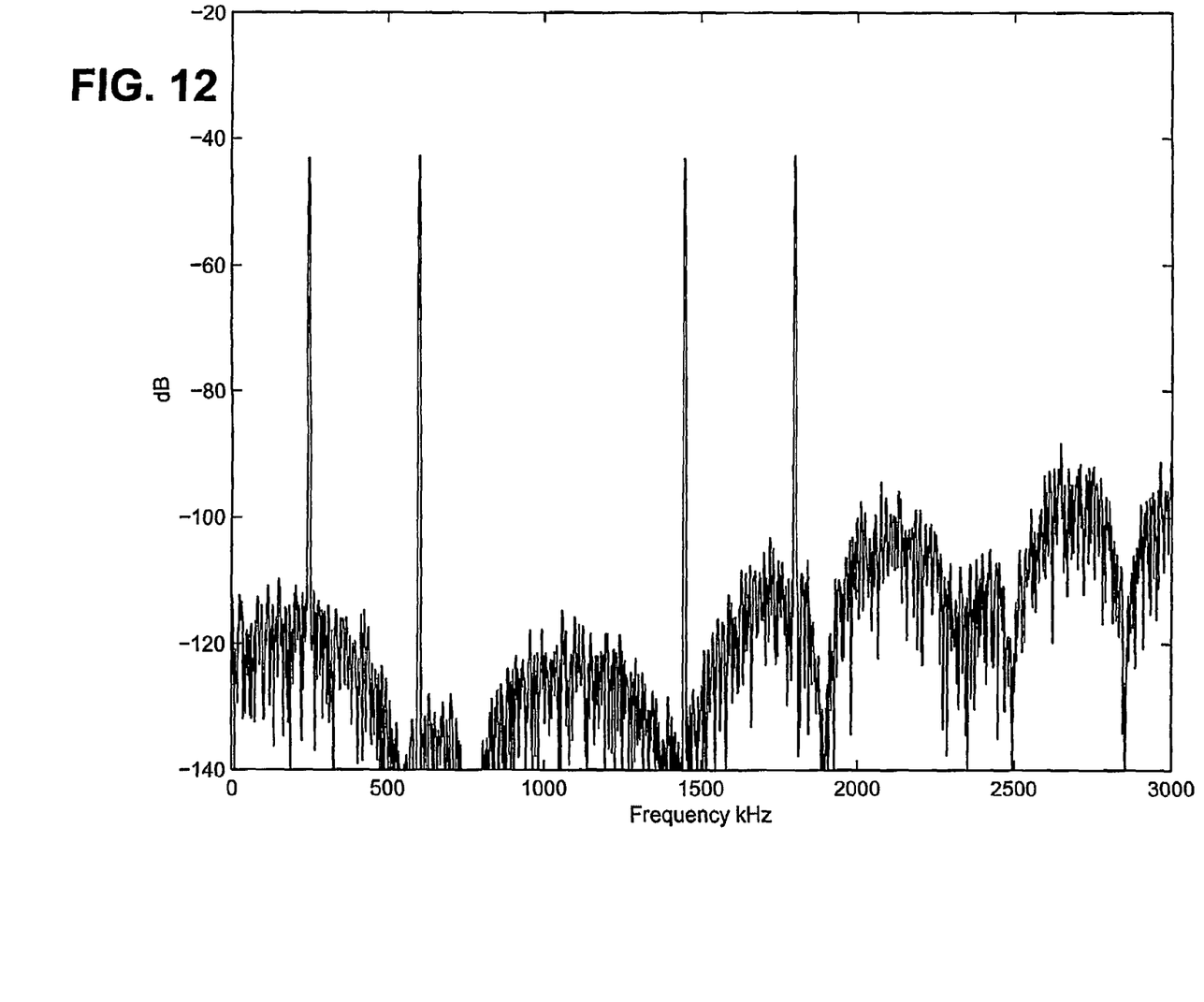

FIG. 11 shows the spectrum of signals 34 and 36 at the output of the decimation filtering and down-sampling blocks 31 and 32. At this point the quantisation noise beyond 1200 kHz and the high frequency tones have been significantly attenuated. FIG. 12 shows the spectrum of signals 64 and 66 at the output of mixers 51 and 52. The mixing operation has restored components at 600 kHz and 1800 kHz but unwanted components are visible at 1024 kHz−776 kHz=248 kHz and 1024 kHz+424 kHz=1448 kHz.

Figure 13:
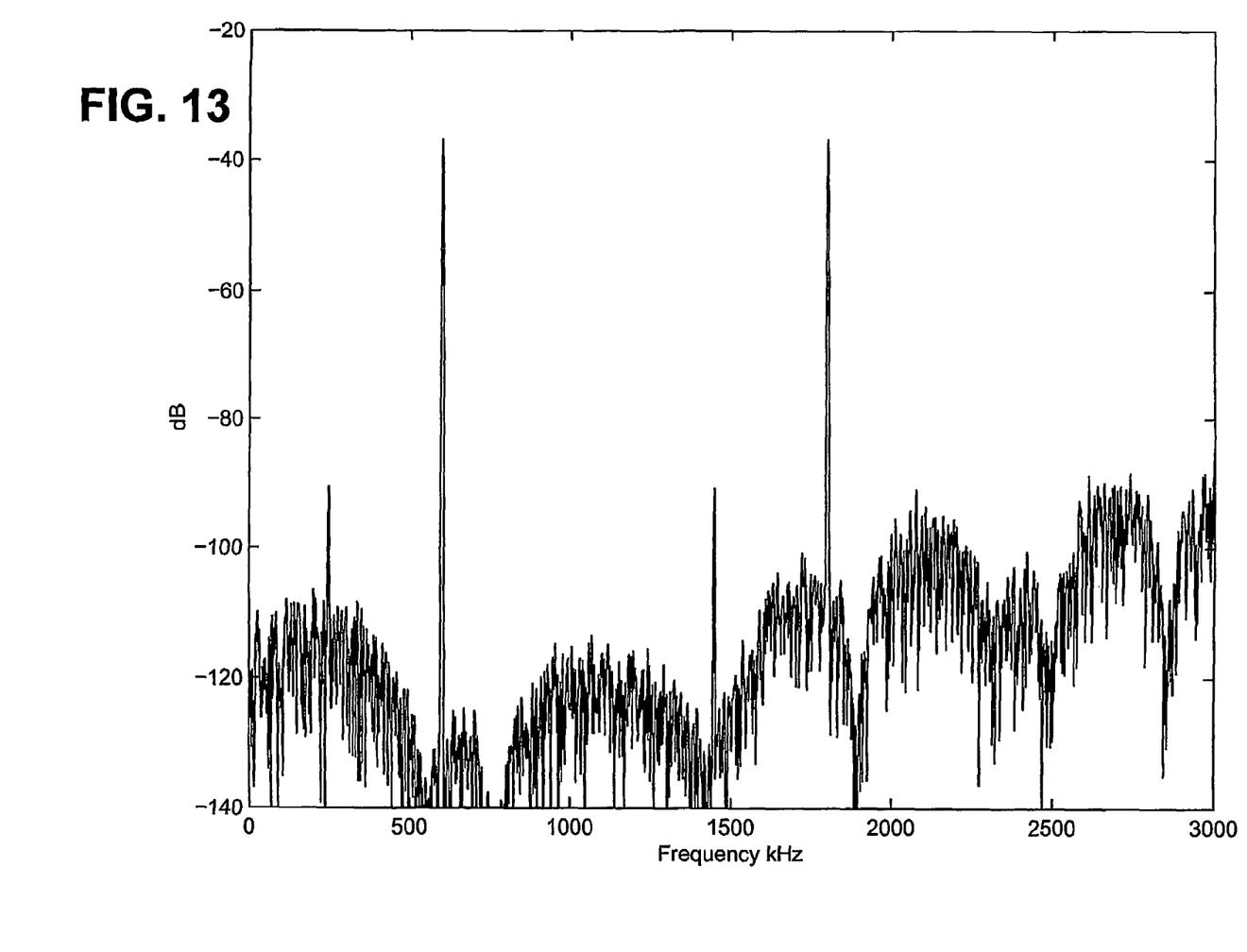
FIG. 13 illustrates the spectrum of an example of the signal at the output of the sigma-delta analog-to-digital converter arrangement of FIG. 1.

Finally, FIG. 13 shows the spectrum of signal 90 at the output of the ADC, after adder 80. Re-combining signals 64 and 66 has allowed the unwanted tones at 248 kHz and 1448 kHz to be significantly reduced while the original tones at 600 kHz and 1800 kHz have been increased by 6 dB. The unwanted tones could be fully eliminated if capacitor matching were better. However, for illustration purposes this imperfection has been exaggerated in this example. In fact, a resolution of the ADC beyond 12 bits could still afford a capacitor mismatch in the order of one percent, which is easily achievable.

It will be understood that the parallel translating sigma-delta analog-to-digital converter described above provides the following advantages:

It allows the signal bandwidth to be doubled for almost the same resolution without the need for doubling the sampling frequency. This reduces the power consumption compared to a solution with a double clock speed, making this converter particularly suitable for use in wireless telephones.

Both the embedded sigma-delta modulators and the digital filters and mixers lend themselves for being adjusted to other communication standards. This makes this converter suitable for multi-mode or multi-standard wireless telephones.

In the above-described converter, with respect to such a wireless telephone application, the rejection of an interferer in an adjacent channel and an alternate channel is related to the ability of the translating sigma-delta modulator to suppress the third and fifth harmonics respectively. This suppression has been achieved with the particular switching sequences of the translating sigma-delta modulators.

It will be understood that the converter will typically be fabricated in an integrated circuit (not shown).

It will be further appreciated that other alternatives to the embodiment of the invention described above will be apparent to a person of ordinary skill in the art.

We claim:

1. A sigma-delta analog-to-digital converter arrangement comprising:
   first translating sigma-delta analog-to-digital converter for receiving an analog signal for translation from an input bandwidth and input frequency to a reduced bandwidth frequency band with a first phase shift and conversion to a first digital signal;
   first mixer reverse frequency translating a processed first digital signal; second translating sigma-delta analog-to-digital converter for receiving the analog signal for translation from an input bandwidth and input frequency to a reduced bandwidth frequency band with a second phase shift and conversion to a second digital signal;
   second mixer reverse frequency translating a processed second digital signal; and
   a summer for summing reverse frequency translated processed digital signals to produce a digital output signal at the input bandwidth and input frequency
   wherein the first and second translating sigma-delta analog-to-digital converters comprise switched capacitors arranged to use switching sequences that produce reduced third and fifth harmonics in the digital output signal.

2. The arrangement of claim 1, wherein the first phase shift and the second phase shift are in quadrature or almost in quadrature.

3. The arrangement of claim 2, further comprising means for adjusting for quadrature errors between signals in the first and second translating sigma-delta analog-to-digital converters.

4. The arrangement of claim 1, wherein the first and second translating sigma-delta analog-to-digital converters each comprise a multiplicity of capacitors of substantially equal value or a multiplicity of capacitors of whose values are in a binary-weighted relationship.

5. The arrangement of claim 1, wherein the switching sequences comprise unit coefficients.

6. The arrangement of claim 1, wherein the switching sequences comprise binary-weighted coefficients.

7. The arrangement of claim 1, further comprising:
   first decimation filtering and down-sampler and first DC notch filter coupled between the output of the first translating sigma-delta analog-to-digital converters and the summer; and
   second decimation filter and down-sampler and second DC notch filter coupled between the output of the second translating sigma-delta analog-to-digital converter and the summer.

8. The arrangement of claim 1, wherein the first and second mixer means are arranged to produce reverse first and second phase shifts in quadrature or almost in quadrature to compensate for quadrature error present between the phase shifts introduced in first and second translating sigma-delta analog-to-digital converter means respectively.

9. The arrangement of claim 1, arranged for use in a wideband CDMA wireless communication system.

10. The arrangement of claim 1 arranged for use in a multi-standard wireless communication system.

11. An integrated circuit comprising the arrangement of claim 1.

12. A method for sigma-delta analog-to-digital conversion comprising: providing first translating sigma-delta analog-to-digital converter receiving an analog signal, translating from an input bandwidth and input frequency to a reduced bandwidth frequency band with a first phase shift and converting to a first digital signal;
   reverse frequency translating a processed first digital signal; providing second translating sigma-delta analog-to-digital converter receiving the analog signal, translating from an input bandwidth and input frequency to a reduced bandwidth frequency band with a second phase shift and converting to a second digital signal;
   reverse frequency translating a processed second digital signal; and summing reverse frequency translated processed digital signals to produce a digital output signal at the input bandwidth and input frequency,
   wherein the steps of reverse frequency translating comprise using switching sequences that produce reduced third and fifth harmonics in the digital output signal.

13. The method of claim 12, wherein the first phase shift and the second phase shift are in quadrature or almost in quadrature.

14. The method of claim 12, wherein the step of using switching sequences comprises using unit coefficients.

15. The method of claim 12, wherein the step of using switching sequences comprises using binary-weighted coefficients.

16. The method of claims 12, further comprising adjusting for quadrature errors between signals applied to the first and second translating sigma-delta analog-to-digital converters.

17. The method of claim 12, further comprising:
   providing first decimation filtering and down-sampling, first DC notch filtering and a first mixer between the output of the first translating sigma-delta analog-to-digital converter and the summer; and
   providing second decimation filtering and down-sampling, second DC notch filtering and second mixer between the output of the second translating sigma-delta analog-to-digital converter and the summer.

18. The method of claim 12, wherein the step of reverse frequency translating a processed digital signal is performed in quadrature or almost in quadrature to compensate for quadrature error present between the phase shifts introduced in first and second translating sigma-delta analog-to-digital converter respectively.

19. The method of claim 12, used in a wideband CDMA wireless communication system.

* * * * *